United States Patent [19]

Sugahara

[11] Patent Number: 5,239,265
[45] Date of Patent: Aug. 24, 1993

[54] DISPLAY DEVICE OF BIO-ELECTRICAL, BIO-PHYSICAL PHENOMENA

[75] Inventor: Tomio Sugahara, Osaka, Japan
[73] Assignee: Sugan Company Limited, Osaka, Japan
[21] Appl. No.: 826,890
[22] Filed: Jan. 29, 1992

[30] Foreign Application Priority Data

Oct. 3, 1991 [JP] Japan ............................. 3-283990

[51] Int. Cl.$^5$ .............................................. G01R 33/20
[52] U.S. Cl. ........................................ 324/309; 358/81; 378/4; 128/653.5
[58] Field of Search ............... 324/300, 307, 309, 318, 324/322; 378/4; 358/81; 128/653.5

[56] References Cited

U.S. PATENT DOCUMENTS

4,851,900  7/1989  Edwards et al. ................... 358/81
5,023,895  6/1991  McCroskey et al. ................ 378/4

Primary Examiner—Michael J. Tokar
Attorney, Agent, or Firm—Lockwood Alex FitzGibbon & Cummings

[57] ABSTRACT

Detection signals (about several microvolts) of bio-electrical and bio-physical phenomena from a patient are amplified to a prescribed level through a magnetically shielded preamplifier, and displayed as waveforms on the screen of a display device installed at a place free from magnetic effects.

The waveforms are, however, not amplified so much by the preamplifier in order to prevent formation of distortion in the detection signals.

The waveforms displayed on the screen are taken by a video camera, and video signals are picked up from the camera. The video signals are, unlike the feeble detection signals directly obtained from the human body, stable image information, and when they are transmitted again to the place of magnetic resonance CT apparatus (that is, the place exposed to magnetic effects), they are hardly influenced by the magnetism.

The video signals are displayed again as waveforms on a magnetically shielded video display device. Thus, the physician can monitor the results of examination obtained by the detecting apparatus of bio-electrical and bio-physical phenomena of patient, at a position near the patient.

2 Claims, 2 Drawing Sheets

DISPLAY DEVICE OF BIO-ELECTRICAL, BIO-PHYSICAL PHENOMENA

BACKGROUND OF THE INVENTION

1. Field of the Invention

The present invention relates to a display device for monitoring the bio-electrical and bio-physical phenomena of a patient, while performing tomography of patient by means of magnetic resonance imaging apparatus.

2. Description of the Prior Art

In order to observe the inside of the body without giving pain to the patient (the subject), recently, without using radiations such as X-ray, it is proposed to employ the magnetic resonance imaging apparatus (MRI diagnostic apparatus) for taking tomograms by image processing of magnetic resonance signals, by making use of the phenomenon that a very feeble magnetic resonance signal is released from protons such as hydrogen in the body by applying a static magnetic field to the human body, and further applying a slant magnetic field and weak high frequency magnetic field in pulses.

In such MRI apparatus, a magnetic such as a superconductive magnet is used inorder to apply a strong magnetic field to the human body, and in the examination room comprising such magnet, a strong magnetic field is present due to the magnet.

By using such MRI apparatus, for example, when taking a tomogram of an ailing region in a patient with heart disease, continuous monitoring of the bio-electrical and bio-physical phenomena of patient such as electrocardiogram and blood pressure during tomography by the operation or physician engaged in the operation of the MRI apparatus is extremely important for taking an adequate tomographic view for the patient and also for appropriate diagnosis and treatment.

Accordingly, to perform tomography by using the MRI apparatus, the patient is equipped with, as required, the detecting devices for bio-electrical and bio-physical phenomena, such as electrocardiograph and electronic direct blood pressure meter. These detecting devices convert the biological reactions of the patient into feeble electric signals (detection signals), and display the waveforms in the display unit composed of cathode-ray tube, liquid crystal panel or the like incorporated in the detecting devices.

Such detecting devices (display units) are susceptible to the effects of magnetic field, and the detection signals from the patient are shown on the display unit of the detecting device installed in other room (monitoring room) that is shielded magnetically.

Therefore, the operator or physician performs tomographic examination of the patient, diagnosis or treatment by manipulating the console while monitoring the detecting devices installed in the monitoring room (see FIG. 2).

In such constitution, however, that the detection signals of bio-electrical and bio-physical phenomena by electrocardiograph and others are monitored in a monitoring room remote from the examination room, since the patient examination room and the display room of detecting devices are different, it was difficult to diagnose and treat properly depending on the condition of the patient.

That is, if any abnormality is found in the bio-electrical and bio-physical phenomena of patient, the physician must give an immediate treatment depending on the situation of the patient. However, as in this constitution, when the display device room (monitoring room) and the patient room (examination room) are different, it takes a certain time for the physician to reach the patient after discovering the change in the state of the patient disclosed in the detecting device, and it is difficult to react promptly to the change of the state of the patient.

Or, as shown in FIG. 2, if the monitoring room and examination room are partitioned by a transparent material such as glass, the waveform displayed on the detecting device is a small waveform because the initial detection signal from the human body is only about several millivolts, but it is not magnified so much because the waveform is distorted. It was therefore difficult to judge small changes of the state of the patient only by monitoring the detection waveform displayed on the detecting device from other room.

BRIEF SUMMARY OF THE INVENTION

It is hence a primary object of the invention to present, in the light of the above problems in the prior art, a display device of bio-electrical and bio-physical phenomena making it possible to monitor the bio-electrical and bio-physical phenomena of the patient closely beside the patient, when taking tomograms by using of the magnetic resonance imaging apparatus.

It is other object of the invention to present a display device of bio-electrical and bio-physical phenomena capable of achieving the above result by simple and low-cost modification only by attaching optionally to the existing detecting device of bio-electrical and bio-physical phenomena.

These and other objects as well as the features and characteristics of the invention will be better understood and appreciated by reading the following detailed description in conjunction with the accompanying drawings and novel facts disclosed in the claims.

DETAILED DESCRIPTION OF THE PREFERRED EMBODIMENT

Figure 1:
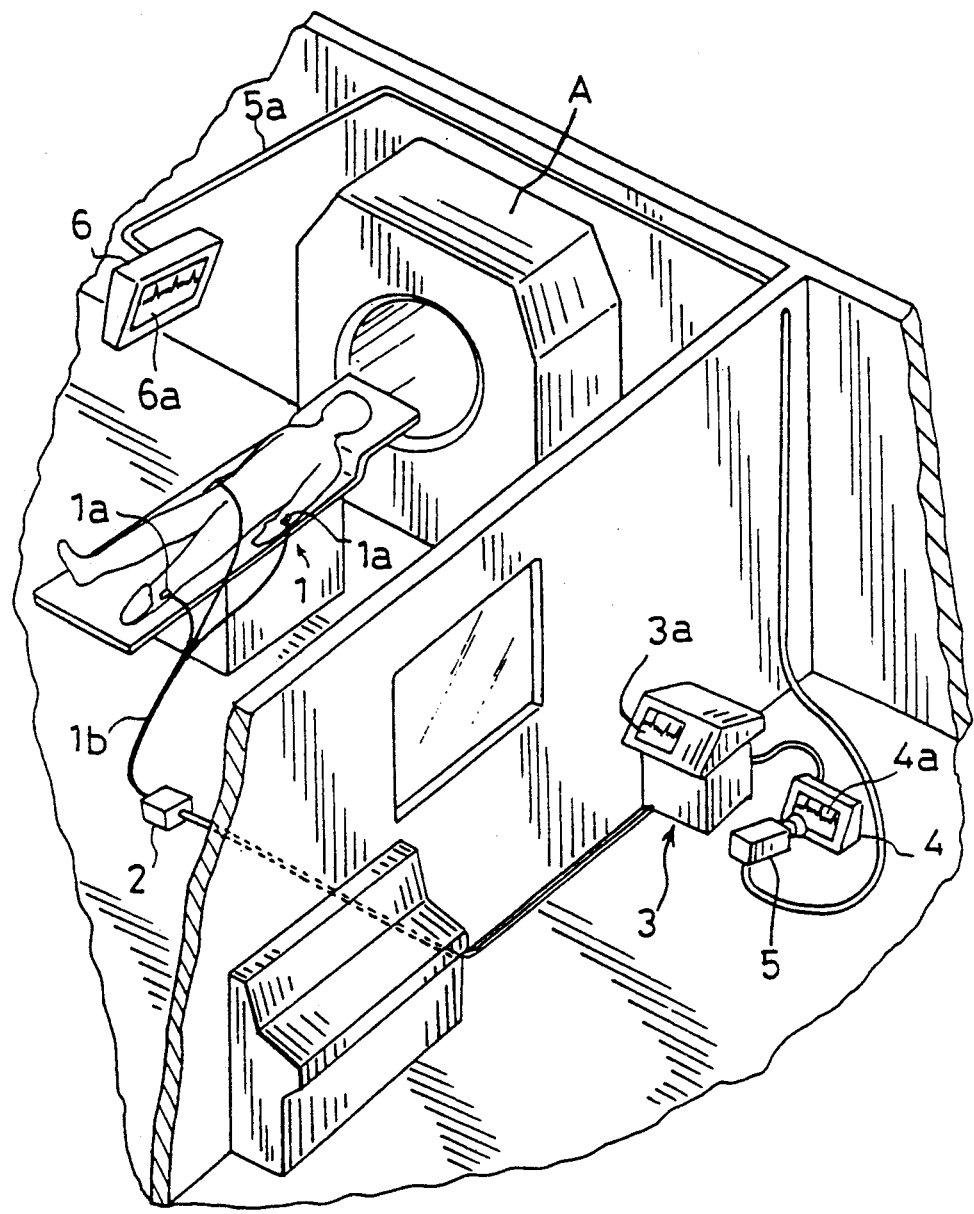
FIG. 1 is a perspective view showing the state of tomography using the display device of bio-electrical and bio-physical phenomena in one of the embodiments of the invention.
Figure 2:
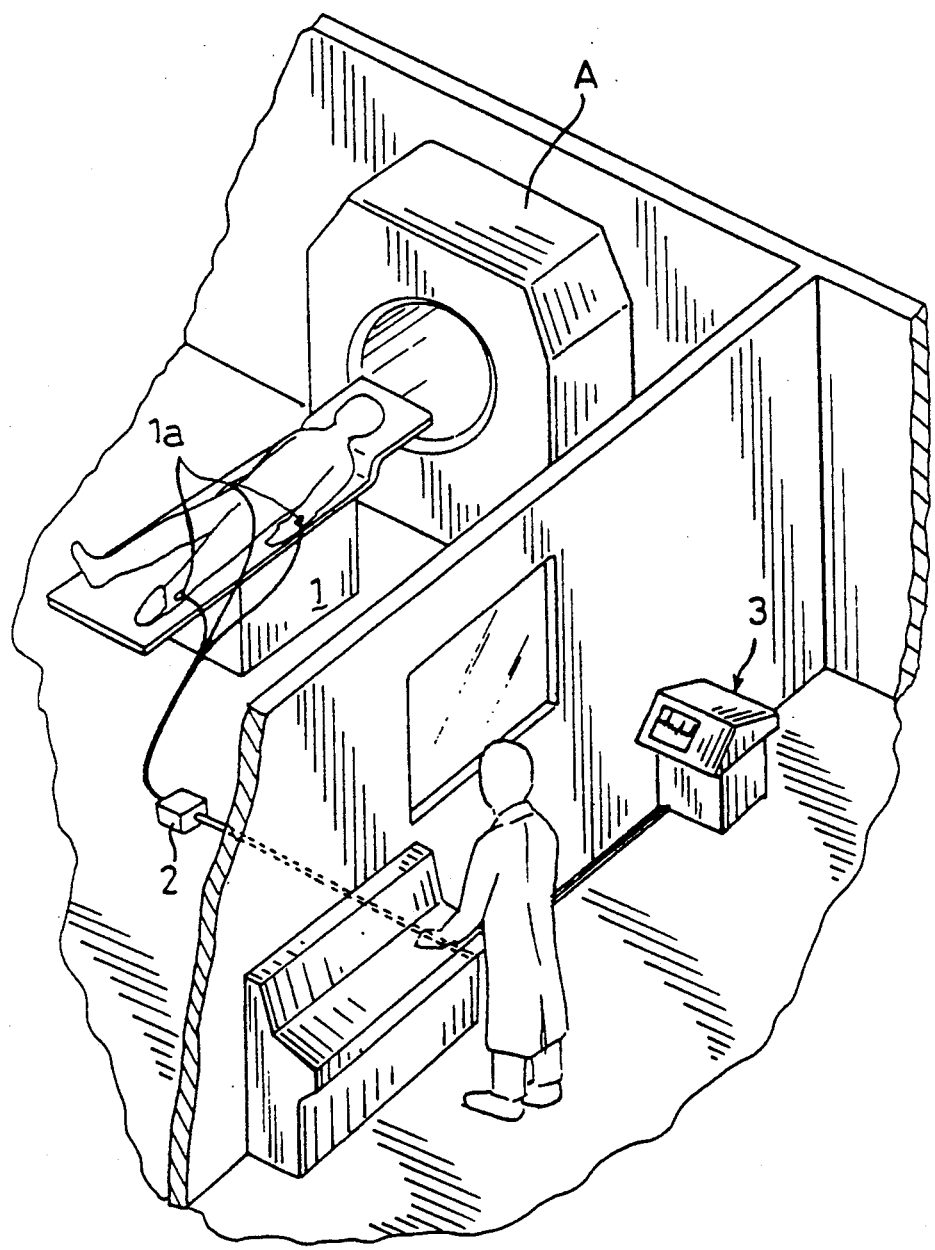
FIG. 2 is a perspective view showing the conventional display device of bio-electrical and bio-physical phenomena in the process of tomography.

An embodiment of the display device of bio-electrical and bio-physical phenomena of the invention is described below while referring to the drawing.

As shown in FIG. 1, the display device of bio-electrical and bio-physical phenomena of the invention is the device for displaying the bio-electrical and bio-physical phenomena of patients installed at a close position to a magnet A of the magnetic resonance imaging apparatus, comprising an accessory 1 for detection of bio-electrical and bio-physical phenomena, a preamplifier 2, a detection device 3 of bio-electrical and bio-physical phenomena, a display device 4, a video camera 5, and a video signal display device 6.

The accessory 1 for detection of bio-electrical and bio-physical phenomena (in this embodiment, an electrode 1 for electrocardiograph) is intended to attach electrodes 1a ... to limbs and other parts of the body of the patients, and induce the active potentials of the cardiac muscles from the body surface by means of the electrodes 1 a .... The active potential (detection signal) induced to the electrode 1a is transmitted to the preamplifier 2 through a transmission line 1b.

The preamplifier 2 is intended to amplify the detection signals transmitted from the electrodes 1a ..., which are extremely feeble at about several millivolts, in order to compensate for the line loss occurring in the process of transmitting to the detecting device 3. That is, the detection signals are amplified to such a level that the waveform may not be deformed by line loss. Incidentally, if the amplification factor of this preamplifier 2 is too high, the waveform of detection signal is distorted, and therefore it is not so high.

The detecting device 3 is installed in a place free from effects of the magnetic field generated by the magnet A of the magnetic resonance imaging apparatus, that is, in a magnetically shielded room separate from the magnet A (monitoring room). The detecting device 3 has a display unit 3a composed of cathode-ray tube, liquid crystal panel or the like, and the waveform of the detection signal transmitted from the preamplifier 2 is shown on the display unit 3a in analog display. More specifically, the waveforms of the detection signals changing every moment are displayed continuously, and the bio-electrical and bio-physical phenomena of the patients are displayed sequentially.

On the other hand, the display device 4 having the function for displaying the waveforms are connected parallel to the detecting device 3, and the same waveform as the waveform displayed on the display unit 3a of the detecting device 3 is displayed in the display unit 4a of the display device 4.

The waveform displayed on the display device 4 is taken in real time by the video camera 5. The image of the waveform taken by the video camera 5 is converted into a video signal, and is sent out again to the room of the magnetic resonance imaging apparatus (examination room) through a magnetically shielded transmission line 5a.

The video signal display device 6 is installed at a position close to the patient, that is, at a position close to the magnet A of the magnetic resonance imaging apparatus, at a level visually monitored by the physician. This video signal display device 6 has a display unit 6a made of liquid crystal panel or a similar material, and is intended to reproduce and display the video signal sent from the video camera 5 on the display unit 6a. The video signal display device 6 has its outside magnetically shielded by means of antimagnetic material such as copper plate and is liberated from the effects of magnetic field, and its image is supposed to be free from effects even if a magnetic field is generated in the examination room by the magnet of the magnetic resonance imaging apparatus.

Therefore, the bio-electrical and bio-physical phenomena detected by the detecting device 3 of bio-electrical and bio-physical phenomena are displayed on the display unit 6a of the video signal display device 6 in real time.

The display device of bio-electrical and bio-physical phenomena of the invention may be modified and designed freely, not being limited to the above embodiment alone.

For example, in this embodiment, the detecting device 3 and display device 4 are connected in parallel, and it is because it is easier to monitor for the operator of the magnetic resonance imaging apparatus when the detecting device 3 for monitoring the bio-electrical and bio-physical phenomena of the patient and the display device 4 for feeding video signal to the video signal display device 6 to be monitored by the physician near the patient are installed separately, and instead of installing the display device 4, the waveform of the detecting device 3 may be directly taken by the video camera 5.

Meanwhile, the display device of bio-electrical and bio-physical phenomena of the invention may be also applied in magnetic resonance spectral apparatus (MRS).

Being thus composed, the invention brings about the following effects.

(1) At the time of tomography of the patient by using the magnetic resonance imaging apparatus, the display device of the bio-electrical and bio-physical phenomena showing the measurement results of the bio-electrical and bio-physical phenomena performed simultaneously is composed of display means for displaying the detection signals of bio-electrical and bio-physical phenomena of patient on a display device installed at a place free from effects of magnetism, image pickup means for taking the detection signals displayed in the display device by a video camera, and video signal display means for displaying the video output signals taken out from the video camera in the video signal display device which is magnetically shielded and installed near the patient, so that the physician may diagnose and treat immediately depending on the condition of the patient.

That is, the bio-electrical and bio-physical phenomena of the patient displayed in the display device are shown in real time at a close position to the magnetic resonance imaging apparatus, that is, at a close position to the patient, so that the changes in the state of the patient may be always monitored.

Therefore, during tomographic operation, the physician can monitor the transition of bio-electrical and bio-physical phenomena of the patient while standing by always beside the patient, if any change is found, an immediate diagnosis or treatment may be given.

(2) The display device of bio-electrical and bio-physical phenomena of the invention is intended to take the waveform of detection signal shown on the display device by video camera and display it, and it is therefore easy to install the display device, and the waveform displayed in the existing detecting device of bio-electrical and bio-physical phenomena may be directly used, and the cost for modification of the equipment may be kept to a minimum.

The practical embodiment described herein is intended only to clarify the technical content of the invention, and the invention should not be interpreted in a narrow sense by limiting to this embodiment alone, but should be understood in a wider sense to include all modifications falling within the scope and spirit of the invention.

What is claimed is:

1. A display device of bio-electrical and bio-physical phenomena for detection of bio-electrical and bio-physical phenomena of a patient simultaneously with tomography in the process of tomography of the patient by means of magnetic resonance imaging apparatus, comprising:

display means for displaying detection signals of bio-electrical and bio-physical phenomena from the patient on a display device installed in a place free from effects of magnetism, image pickup means for taking the detection signals displayed on the display device by a video camera, and video signal display means for displaying the video output signals taken out from the video camera on a video signal display device which is magnetically shielded and installed at a close position to the patient.

2. A display device of bio-electrical and bio-physical phenomena for examination of bio-electrical and bio-physical phenomena of a patient simultaneously with tomography in the process of tomography of the patient by means of magnetic resonance imaging apparatus, comprising:

image pickup means for taking the display means displaying the detection signals of bio-electrical and bio-physical phenomena from the patient by a video camera, and video signal display means for displaying the video output signals taken out from the video camera on a video signal display device which is magnetically shielded and installed at a close position to the patient.

* * * * *